(12) United States Patent
Shu et al.

(10) Patent No.: US 12,094,723 B2
(45) Date of Patent: Sep. 17, 2024

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Yuejiao Shu, Hefei (CN); Ming-Pu Tsai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 545 days.

(21) Appl. No.: 17/442,308

(22) PCT Filed: Jun. 30, 2021

(86) PCT No.: PCT/CN2021/103694
§ 371 (c)(1),
(2) Date: Sep. 23, 2021

(87) PCT Pub. No.: WO2022/057381
PCT Pub. Date: Mar. 24, 2022

(65) Prior Publication Data
US 2023/0055490 A1     Feb. 23, 2023

(30) Foreign Application Priority Data

Sep. 15, 2020   (CN) .......................... 202010966611.7

(51) Int. Cl.
*H10B 12/00*     (2023.01)
*H01L 21/027*    (2006.01)
*H01L 21/3213*   (2006.01)

(52) U.S. Cl.
CPC .... *H01L 21/32139* (2013.01); *H01L 21/0273* (2013.01); *H10B 12/482* (2023.02)

(58) Field of Classification Search
CPC ........... H01L 21/32139; H01L 21/0273; H01L 21/31144; H10B 12/482; H10B 12/00; H10B 12/01
See application file for complete search history.

(56) References Cited

U.S. PATENT DOCUMENTS

| | | | |
|---|---|---|---|
| 8,324,049 | B2 | 12/2012 | Kim et al. |
| 8,435,855 | B2 | 5/2013 | Kim et al. |

(Continued)

FOREIGN PATENT DOCUMENTS

| | | |
|---|---|---|
| CN | 101794736 A | 8/2010 |
| CN | 103247577 A | 8/2013 |

(Continued)

OTHER PUBLICATIONS

International Search Report cited in PCT/CN2021/103694 mailed Oct. 9, 2021, 9 pages.

(Continued)

*Primary Examiner* — Kyoung Lee
*Assistant Examiner* — Sophia W Kao
(74) *Attorney, Agent, or Firm* — Syncoda LLC; Feng Ma (57) ABSTRACT

The present disclosure provides a method for forming semiconductor structure and a semiconductor structure. The method for forming semiconductor structure includes: providing a semiconductor base with a substrate and a first oxide material layer; wherein the first oxide material layer is arranged on the substrate, the first oxide material layer includes a first region and a second region located at edge of the first region; patterning and etching the first oxide material layer; wherein oxide line structures are formed, and an annular empty slot structure is formed; refilling a second material; wherein the second material in the first region forms a plurality of isolation line structures, and the second material in the second region forms an annular dummy (Continued)

isolation layer; removing the oxide line structure by patterning and etching, and forming through hole structures; and forming a conductive material layer in the through hole structures.

10 Claims, 7 Drawing Sheets

(56) References Cited

U.S. PATENT DOCUMENTS

| | | | |
|---|---|---|---|
| 8,865,547 B2 | 10/2014 | Kang | |
| 9,184,168 B2 | 11/2015 | Ryu et al. | |
| 9,515,022 B2 | 12/2016 | Kwon et al. | |
| 9,608,077 B1 | 3/2017 | Kye et al. | |
| 10,269,808 B2 | 4/2019 | Kim et al. | |
| 10,541,302 B2 * | 1/2020 | Yoon | H10B 12/50 |
| 10,847,519 B2 | 11/2020 | Ji et al. | |
| 10,943,908 B2 | 3/2021 | Bae et al. | |
| 11,411,010 B2 * | 8/2022 | Seong | H10B 12/0335 |
| 2009/0140437 A1 | 6/2009 | Saeki | |
| 2011/0151632 A1 | 6/2011 | Cho | |
| 2020/0402981 A1 * | 12/2020 | Kim | H10B 12/485 |

FOREIGN PATENT DOCUMENTS

| | | |
|---|---|---|
| CN | 103811554 A | 5/2014 |
| CN | 105719998 A | 6/2016 |
| CN | 106504985 A | 3/2017 |
| CN | 107393918 A | 11/2017 |
| CN | 108933136 A | 12/2018 |
| CN | 110364479 A | 10/2019 |
| CN | 110943085 A | 3/2020 |
| CN | 110970351 A | 4/2020 |
| CN | 210607254 U | 5/2020 |

OTHER PUBLICATIONS

International Search Report cited in PCT/CN2021/103691 mailed Sep. 27, 2021, 8 pages.

* cited by examiner

METHOD FOR FORMING SEMICONDUCTOR STRUCTURE AND SEMICONDUCTOR STRUCTURE

CROSS-REFERENCE TO RELATED APPLICATIONS

The present disclosure is a national stage of International Patent Application No. PCT/CN2021/103694, filed on Jun. 30, 2021, which claims the priority to Chinese Patent Application No. 202010966611.7, titled "METHOD FOR FORMING SEMICONDUCTOR STRUCTURE AND SEMICONDUCTOR STRUCTURE", filed on Sep. 15, 2020. The entire contents of International Patent Application No. PCT/CN2021/103694 and Chinese Patent Application No. 202010966611.7 are incorporated herein by reference.

TECHNICAL FIELD

The present disclosure relates to the technical field of semiconductors, in particular to a method for forming semiconductor structure and a semiconductor structure.

BACKGROUND

In the process of forming node contacts (NC) in existing dynamic random access memory (DRAM), some dummy node contacts, such as array like patterns, will be formed at the edge to ensure the uniformity of effective node contacts during the forming process. However, the silicon oxide in holes of these dummy node contacts will be unstable in the subsequent process, resulting in unnecessary device failure. In the actual process, although relevant regions can be covered by photoresist (AOS PH), an etching solution (such as hydrofluoric acid (HF)) will penetrate outward to hollow out an oxide film when the photoresist is poor in coverage or adhesion. The oxide film after being hollowed out will completely affect the process of forming arrays of the product, thus causing polysilicon (poly) and tungsten (W) to be filled therein, and resulting in Short Fail of bit lines (BL) in the bit line direction or node contacts in the node contact direction.

SUMMARY

According to one aspect of the present disclosure, a method for forming semiconductor structure is provided, comprising:
providing a semiconductor base with a substrate and a first oxide material layer; wherein the first oxide material layer is arranged on the substrate, the first oxide material layer comprises a first region with a bit line structure and a second region located at edge of the first region;
patterning and etching the first oxide material layer, to remove a part of the first oxide material layer in the first region and a part of the first oxide material layer in the second region; wherein oxide line structures are formed on both sides of each bit line structure by a remaining part of the first oxide material layer in the first region, and an annular empty slot structure is formed between a remaining part of the first oxide material layer in the second region and the first region;
refilling a second material in the first region and in the second region, respectively; wherein the second material is different from a material of the first oxide material layer, the second material in the first region forms a plurality of isolation line structures, and the second material in the second region forms an annular dummy isolation layer;
removing the oxide line structure by patterning and etching, and forming through hole structures each between a bit line structure and an isolation line structure next to the bit line structure; and
forming a conductive material layer in the through hole structures to form a semiconductor structure.

According to another aspect of the present disclosure, a semiconductor structure is provided, comprising a substrate, a plurality of bit line structures, a plurality of isolation line structures, an oxide material layer and a dummy isolation layer; the substrate comprises a first region and a second region; the plurality of bit line structures are arranged in the first region of the substrate; the plurality of isolation line structures are arranged in the first region of the substrate, and each isolation line structure is located between two adjacent bit line structures, so that through hole structures exposing the substrate are formed on both sides of each bit line structure, respectively; the oxide material layer is arranged at a boundary of the second region of the substrate; and the annular dummy isolation layer is arranged in the second region of the substrate and between the first region and the oxide material layer.

DETAILED DESCRIPTION

Exemplary embodiments will now be described more fully with reference to the accompanying drawings. However, the exemplary embodiments may be implemented in many forms and should not be construed as being limited to the embodiments described herein. Rather, providing these embodiments allows the present disclosure to be comprehensive and complete and fully communicates the ideas of the exemplary embodiments to those of skill in the art. In the drawings, the same reference numerals denote the identical or similar structures, which will not be described in detail herein.

In this exemplary embodiment, a method for forming semiconductor structure provided in the present disclosure is described by taking a forming process of node contacts applied to dynamic random access memory (DRAM) as an example. Those of skill in the art can readily understand that various modifications, additions, substitutions, deletions or other variations are made to the following specific embodiments in order to apply related designs of the present disclosure to the forming process of node contacts of other types of semiconductor structures, and these variations still fall into the scope of the principle of the method for forming semiconductor structure provided in the present disclosure.

FIGS. 1 to 10 representatively show a schematic diagram of a semiconductor structure in one step of the method for forming semiconductor structure provided in the present disclosure, respectively. FIG. 11 representatively shows a top view of the semiconductor structure in the step shown in FIG. 10. The processes, methods and relationships of the main steps of the method for forming semiconductor structure provided in the present disclosure will be described in detail with reference to the above drawings.

As shown in FIGS. 1 to 10, in this embodiment, a method for forming semiconductor structure provided in the present disclosure comprises following steps.

A semiconductor base is provided, and a substrate 110 and a first oxide material layer 120 are arranged on the substrate 110. The first oxide material layer 120 comprises a first region D1 with a bit line structure 130, and a second region D2 located at the edge of the first region D1.

The first oxide material layer 120 is patterned and etched to remove part of the first oxide material layer 120 in the first region D1 and in the second region D2, so that oxide line structures 140 are formed on both sides of each bit line structure 130 by the remaining first oxide material layer 120 in the first region D1, and an annular empty slot structure 180 is formed between the remaining first oxide material layer 120 in the second region D2 and the first region D1.

A second material 600 which is different from the material of the first oxide material layer 120 is refilled in the first region D1 and the second region D2, respectively. The second material 600 in the first region D1 forms a plurality of isolation line structures 160, and the second material 600 in the second region D2 forms an annular dummy isolation layer 150.

The oxide line structure 140 is removed by patterning and etching, and a plurality of through hole structures 170 exposing the substrate 110 are formed, each through hole structure is between a bit line structure 130 and an isolation line structure 160 next to the bit line structure.

A conductive material layer is formed in each through hole structure 170 to form a semiconductor structure.

In some embodiments, as shown in FIGS. 1 to 6, in this embodiment, the step in which the first oxide material layer 120 is patterned and etched may specifically comprise following steps.

A second mask layer 220 and a first mask layer 210 are arranged on the first oxide material layer 120 in sequence.

The first mask layer 210 is patterned and etched to form a first mask pattern M1.

A second oxide material layer 400 is provided on the surface of the first mask pattern M1 and the surface of the second mask layer 220.

The part of the second oxide material layer 400 located on the top and both sides of the first mask pattern M1 is removed to form a second mask pattern M2.

A first photoresist 500 is arranged on a part of the second mask pattern M2 located in the second region D2.

The second mask layer 220 and the part of the first oxide material layer 120 are etched and removed by taking the second mask pattern M2 as a mask.

It should be noted that, in any exemplary embodiment conforming to the design concept of the present disclosure, the first oxide material layer 120 may also be patterned and etched by other specific process steps, which will not be limited to this embodiment.

Figure 1:
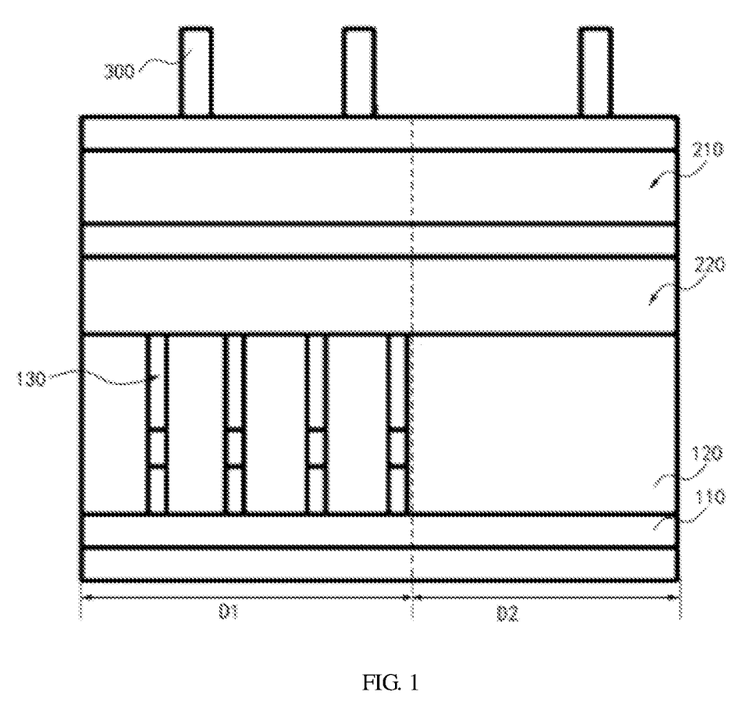
FIG. 1 is a schematic diagram of a semiconductor structure in one step of a method for forming semiconductor structure according to an exemplary embodiment.

Specifically, FIG. 1 representatively shows an exemplary structure of a semiconductor structure in the steps in which "a semiconductor base is provided", "the first mask layer 210 and the second mask layer 220 are arranged" and "a second photoresist 300 is arranged". The semiconductor structure shown in this figure comprises the semiconductor base, the first mask layer 210, the second mask layer 220 and the patterned second photoresist 300. The semiconductor base comprises the substrate 110, the first oxide material layer 120, and the plurality of bit line structures 130. The first oxide material layer 120 is arranged on the surface of the substrate 110, and the bit line structures 130 are arranged on part of the first oxide material layer 120 corresponding to the first region D1. The second mask layer 220 is arranged on the surface of the semiconductor base (i.e., the first oxide material layer 120). The first mask layer 210 is arranged on the surface of the second mask layer 220. The second photoresist 300 is arranged on the surface of the first mask layer 210.

In some embodiments, in this embodiment, the substrate 110 may be a silicon substrate 110.

In some embodiments, in this embodiment, the first oxide material layer 120 may be made of silicon oxide ($SiO_2$).

In some embodiments, in this embodiment, each bit line structure 130 may comprise a metal layer (e.g., tungsten (W)), a plug (e.g., titanium nitride (TiN)), and a protective layer (e.g., silicon nitride ($Si_3N_4$)).

In some embodiments, in this embodiment, the first mask layer 210 may be made of polysilicon and silicon oxynitride.

In some embodiments, in this embodiment, the second mask layer 220 may be made of polysilicon and polycrystalline carbon.

Figure 2:
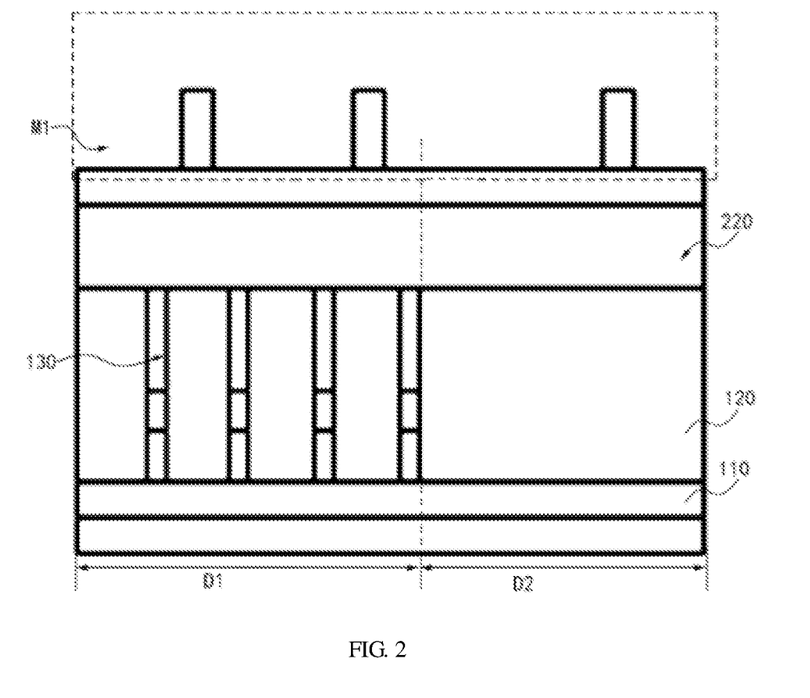
FIG. 2 is a schematic diagram of a semiconductor structure in another step of the method for forming semiconductor structure according to the exemplary embodiment.

Specifically, FIG. 2 representatively shows an exemplary structure of a semiconductor structure in the step in which "a first mask pattern M1 is formed". The semiconductor structure shown in the figure comprises the substrate, the second mask layer 220 and the first mask pattern M1. The first mask pattern M1 is a first mask layer 210 left after being etched.

In some embodiments, as shown in FIGS. 1 and 2, in this embodiment, the step in which "a first mask pattern M1 is formed" may specifically comprise following steps.

The second photoresist 300 is covered on the surface of the first mask layer 210.

The second photoresist 300 is patterned, with the remaining second photoresist 300 corresponding to the bit line structures 130 and the boundary adjacent to the second region D2, as shown in FIG. 1.

The part of the first mask layer 210 not covered by the second photoresist 300 is removed by etching with the second photoresist 300, and a first mask pattern M1 is formed on the remaining first mask layer 210, as shown in FIG. 2.

Figure 3:
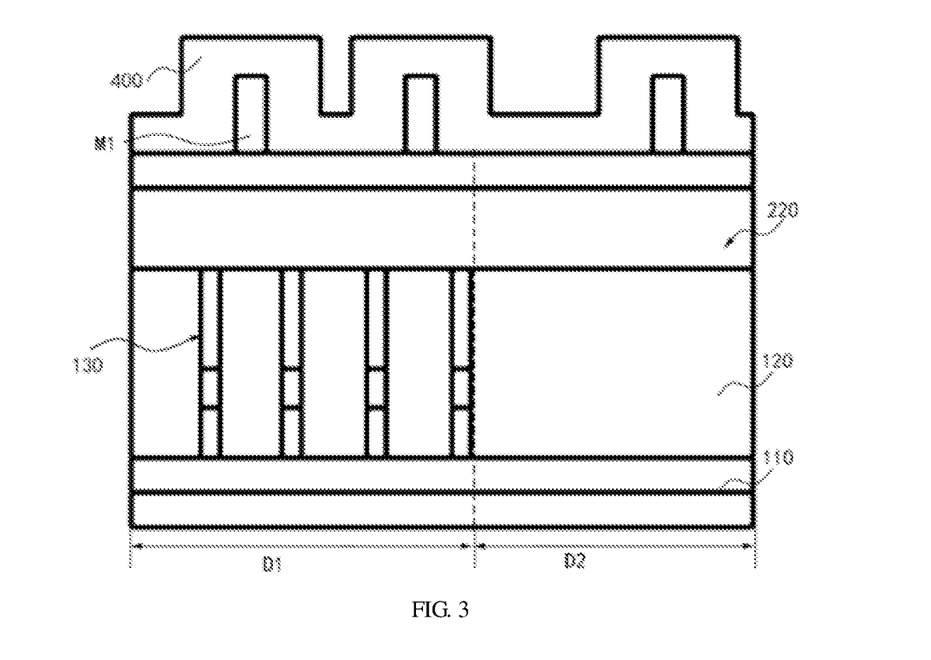
FIG. 3 is a schematic diagram of a semiconductor structure in another step of the method for forming semiconductor structure according to the exemplary embodiment.

Specifically, FIG. 3 representatively shows an exemplary structure of a semiconductor structure in the step in which "a second oxide material layer 400 is arranged". The semiconductor structure shown in this figure comprises the substrate, the second mask layer 220, the remaining first mask layer 210 (i.e., the first mask pattern M1), and the second oxide material layer 400. The second oxide material layer 400 is arranged on the surface of the first mask pattern M1 and the surface of the second mask layer 220 (the part not covered by the first mask pattern M1).

In some embodiments, in this embodiment, the second oxide material layer 400 may be made of silicon oxide.

Figure 4:
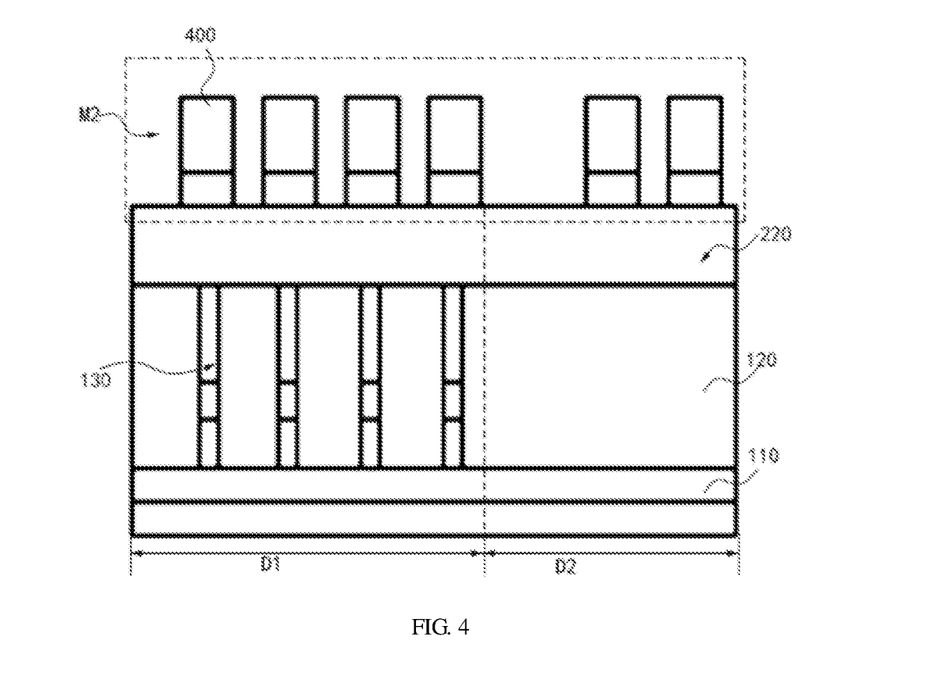
FIG. 4 is a schematic diagram of a semiconductor structure in another step of the method for forming semiconductor structure according to the exemplary embodiment.

In some embodiments, in this embodiment, the step in which a second mask pattern M2 is formed may comprise following steps.

The part of the second oxide material layer 400 located on the top of the first mask pattern M1 and on the surface of the second mask layer 220 (the part not covered by the first mask pattern M1) is removed by etching.

The first mask pattern M1 is removed by etching, i.e., a second mask pattern M2 is formed on the remaining second oxide material layer 400 (the part located on both sides of the first mask pattern M1).

Specifically, FIG. 4 representatively shows an exemplary structure of a semiconductor structure in the step in which "a second mask pattern M2 is formed". The semiconductor structure shown in the figure comprises the substrate and the second mask pattern M2.

In some embodiments, the etch selectivity ratio of the first mask layer 210 to the second oxide material layer 400 may be greater than 1. That is, under the same etching conditions (such as etching solution concentration, temperature, and etching time), the etch rate of the etching solution to the material of the first mask layer 210 is greater than that to the material of the second oxide material layer 400. On this basis, the two etching steps included in the above step in which "a second mask pattern M2 is formed" may be completed in a single etching process without forming other auxiliary materials such as silicone and photoresist required for the patterning process between the two etching steps. Specifically, in the "single etching" process, the part of the second oxide material layer 400 covering the surface of the second mask layer 220 (i.e., the surface not covered by the first mask pattern M1) and covering the top of the first mask pattern M1 may be removed by etching. And then the first mask pattern M1 is directly removed by etching under appropriate etching conditions selected based on the material characteristics that the etch selectivity ratio of the first mask layer 210 to the second oxide material layer 400 is greater than 1, and the part of the second oxide material layer 400 located on both sides of the first mask pattern M1 is reserved, and the reserved oxide material layer 400 and the second mask layer 220 are defined as a second mask pattern M2.

Figure 5:
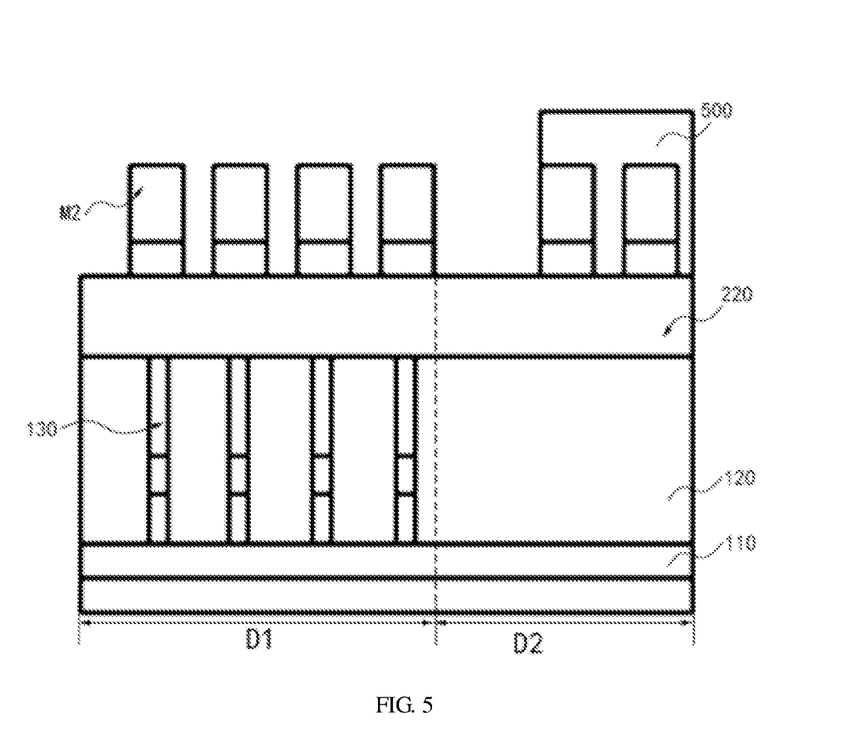
FIG. 5 is a schematic diagram of a semiconductor structure in another step of the method for forming semiconductor structure according to the exemplary embodiment.

Specifically, FIG. 5 representatively shows an exemplary structure of a semiconductor structure in the step in which "a first photoresist 500 is arranged". The semiconductor structure shown in the figure comprises the substrate and the second mask pattern M2.

In some embodiments, as shown in FIG. 5, in this embodiment, the step in which "a first photoresist 500 is arranged" may specifically comprise following steps.

The first photoresist 500 is covered on the surface of the second mask pattern M2.

The first photoresist 500 is patterned, to remove the first photoresist 500 located in the first region D1 and to remove a part of the first photoresist 500 located in the second region D2, wherein the remaining first photoresist 500 is covered on a part of the second mask pattern M2 in the second region D2, and a gap exposing the second mask layer 220 is formed between the part of the second mask pattern M2 covered by the remaining first photoresist 500 and the part of the second mask pattern M2 located in the first region.

Figure 6:
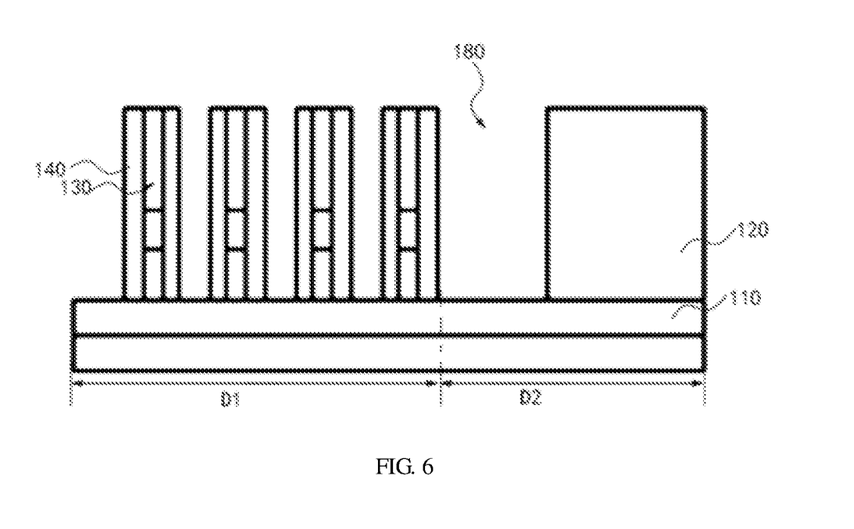
FIG. 6 is a schematic diagram of a semiconductor structure in another step of the method for forming semiconductor structure according to the exemplary embodiment.

Specifically, FIG. 6 representatively shows an exemplary structure of a semiconductor structure in the step in which "part of the first oxide material layer 120 is removed to form oxide line structures 140 and an empty slot structure 180". The semiconductor structure shown in this figure comprises the substrate 110, the plurality of bit line structures 130, and the first oxide material layer 120 left after being etched and removed by taking the second mask pattern M2 as a mask. The remaining part of the first oxide material layer 120 is located on both sides of the bit line structures 130 to form oxide line structures 140, and the other remaining part of the first oxide material layer 120 is located at the boundary of the second region D2, and an empty slot structure 180, which is roughly of an annular structure between the first region D1 and the boundary of the second region D2 when viewed from the top of the semiconductor structure, is formed between the part of the first oxide material layer 120 located in the second region D2 and the first region D1.

In some embodiments, as shown in FIGS. 5 and 6, the step in which "part of the first oxide material layer 120 is removed to form oxide line structures 140 and an empty slot structure 180" may specifically comprises following steps.

The part of the first oxide material layer 120 not covered by the second mask pattern M2 (including the first photoresist 500 on the second mask pattern M2 at the boundary of the second region D2) is etched and removed by taking the second mask pattern M2 as a mask, and the remaining part of the first oxide material layer 120 is located on both sides of the bit line structures 130 and at the boundary of the second region D2, and the oxide line structures 140 are spaced, as shown in FIG. 6.

Figure 7:
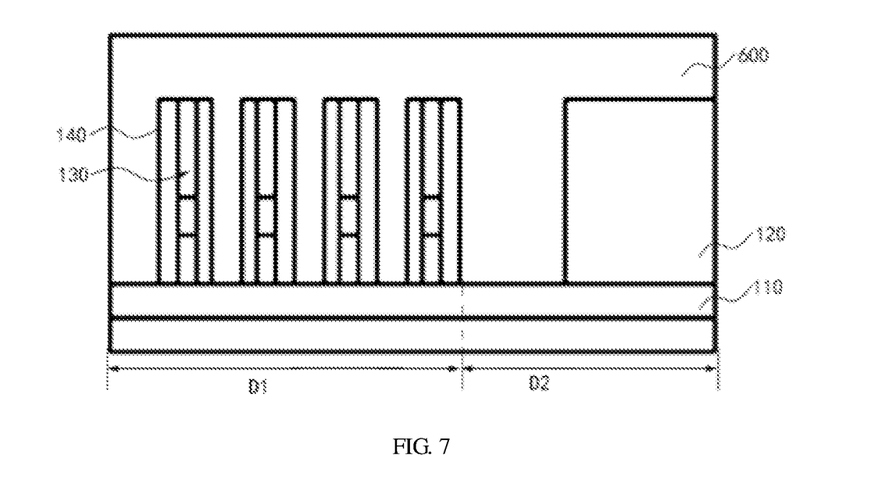
FIG. 7 is a schematic diagram of a semiconductor structure in another step of the method for forming semiconductor structure according to the exemplary embodiment.
Figure 8:
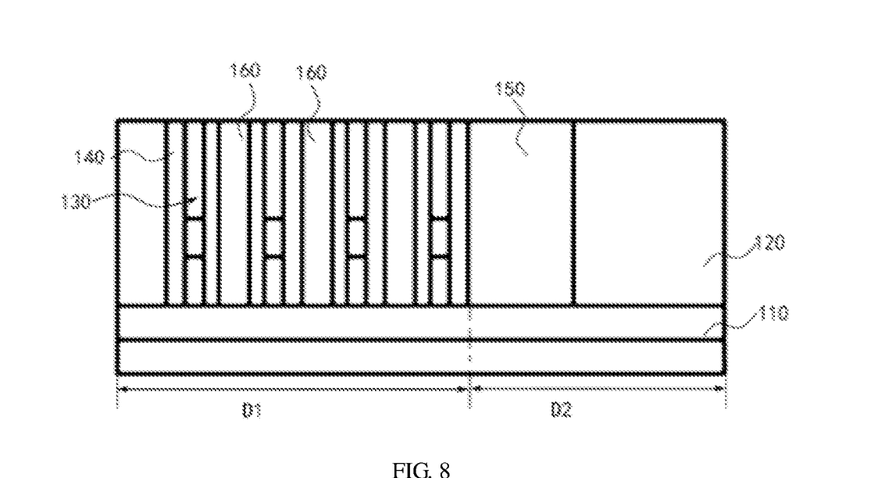
FIG. 8 is a schematic diagram of a semiconductor structure in another step of the method for forming semiconductor structure according to the exemplary embodiment.

Specifically, FIGS. 7 and 8 representatively show exemplary structures of an semiconductor structure in the step in which "the second material 600 is refilled to form a plurality of isolation line structures 160 and a dummy isolation layer 150". The semiconductor structure shown in this figure comprises the substrate 110, the plurality of bit line structures 130, the oxide line structures 140, the remaining first oxide material layer 120 in the second region D2, and the second material 600 refilled. The second material 600 is filled on a part of the surface of the substrate 110 corresponding to the second region D2, and another part (at the boundary) of the surface of the substrate 110 corresponding to the second region D2 is the remaining first oxide material layer 120 in the second region D2, thereby forming the dummy isolation layer 150 made of the second material 600 in the second region D2, that is, the dummy isolation layer 150 is formed by the second material 600 filled in the quick-detachable structure 180. Therefore, the dummy isolation layer 150 is roughly of an annular structure between the boundary of the second region D2 and the first region D1. At the same time, the second material 600 is also filled in the gaps between the oxide line structures 140, so that the isolation line structures 160 made of the second material 600 are formed in the gaps of the oxide line structures 140.

In some embodiments, as shown in FIG. 7 and FIG. 8, in this embodiment, the step in which "the second material 600 is refilled to form a plurality of isolation line structures 160 and a dummy isolation layer 150" may specifically comprises following steps.

After the first oxide material layer 120 is etched with the second mask pattern M2 and the first photoresist 500, the second material 600 is covered on the substrate 110, all bit line structures 130 (including the oxide line structures 140 on both sides), the remaining first oxide material layer 120 in the second region D2 and the surface of the substrate 110 not covered by the above structures, as shown in FIG. 7.

The part of the second material 600 is removed by etching, the removed part of the second material specifically comprises part of the second material higher than the top of each bit line structure 130 and the top of the remaining first oxide material layer 120 in the second region D2. That is, the remaining second material 600 is filled in the gaps among the bit line structures 130 (actually the gaps between adjacent oxide line structures 140) and in the empty slot structure 180, where the second material 600 filled in the gaps among the bit line structures 130 forms the isolation line structures 160, and that filled in the empty slot structure 180 forms the dummy isolation layer 150, as shown in FIG. 8.

In some embodiments, in this embodiment, the second material 600 refilled may be made of silicon nitride.

Figure 9:
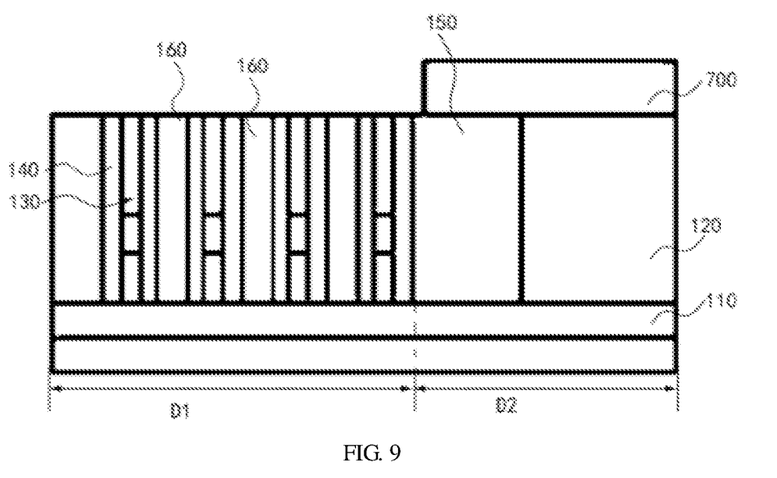
FIG. 9 is a schematic diagram of a semiconductor structure in another step of the method for forming semiconductor structure according to the exemplary embodiment.
Figure 10:
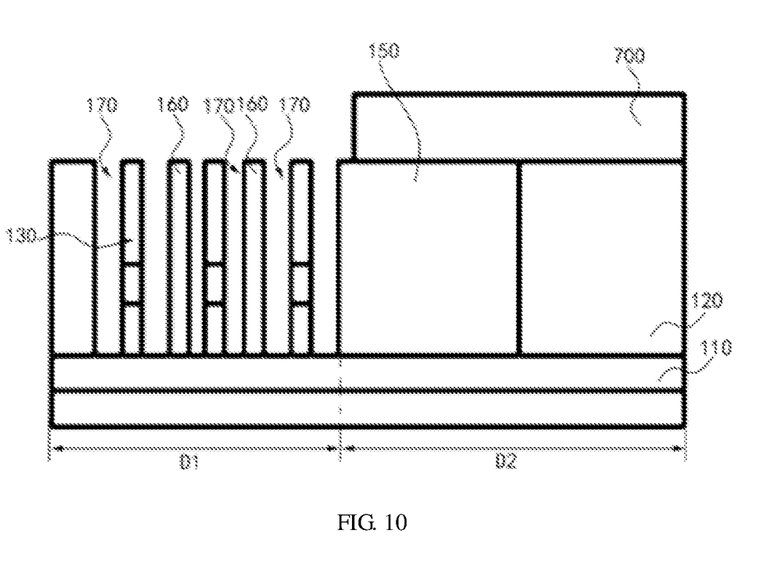
FIG. 10 is a schematic diagram of a semiconductor structure in another step of the method for forming semiconductor structure according to the exemplary embodiment.
Figure 11:
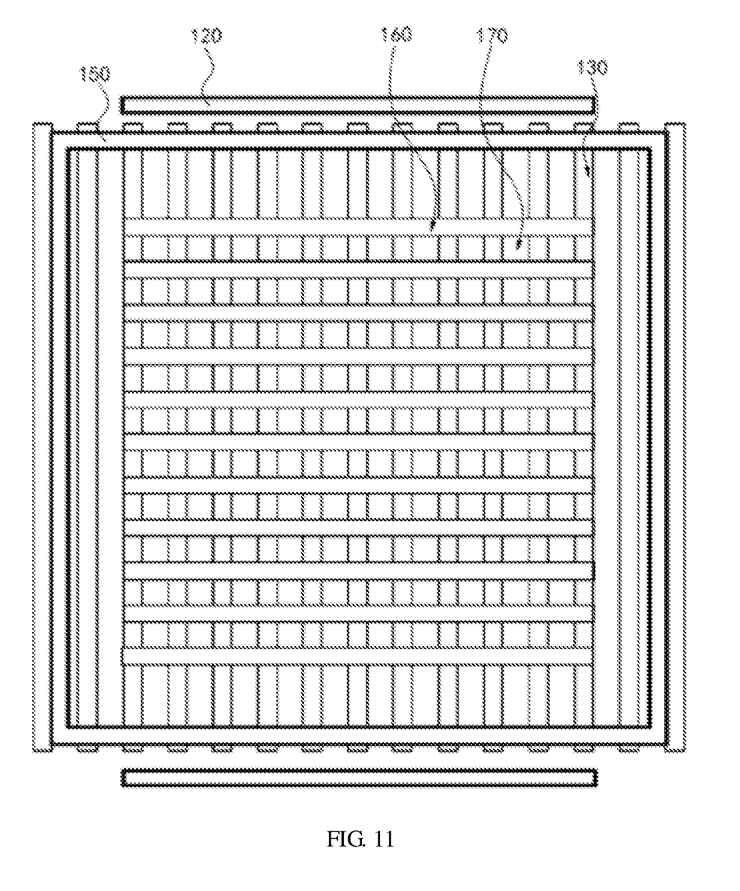
FIG. 11 is a top view of the semiconductor structure in the step shown in FIG. 10.

Specifically, FIGS. 9 and 10 representatively show an exemplary structure of a semiconductor structure in the step in which "the oxide line structures 140 are removed". The semiconductor structure shown in this figure comprises the substrate 110, the plurality of bit line structures 130, the dummy isolation layer 150, the plurality of isolation line structures 160, and the remaining first oxide material layer 120 at the boundary of the second region D2. The dummy isolation layer 150 is located between the boundary of the second region D2 and the first region D1 of the substrate 110, and the isolation line structures 160 are located in the gaps of the bit line structure 130.

In some embodiments, as shown in FIGS. 9 to 10, in this embodiment, the step in which "the oxide line structures 140 are removed" may specifically comprise following steps.

A third photoresist 700 is covered on the surface (including the surface of the second material 600 filled in each gap and empty slot structure 180 and the surface of the remaining first oxide material layer 120 at the boundary of the second region D2) of each bit line structure 130 after the second material 600 is refilled.

The third photoresist 700 is patterned to remove part of the third photoresist 700 corresponding to the first region D1, that is, the third photoresist 700 is reserved on the surface of the dummy isolation layer 150 and the surface of the remaining first oxide material layer 120 at the boundary of the second region D2, as shown in FIG. 9.

The oxide line structure 140 (i.e., the remaining part of the first oxide material layer 120 in the first region D1) is removed by etching with the third photoresist 700, as shown in FIG. 10.

Further, in this embodiment, for the step in which "the remaining part of the first oxide material layer 120 in the first region D1 are removed", the remaining part of the first oxide material layer 120 in the first region D1 may be removed by eroding with an etching solution (such as hydrofluoric acid solution).

It should be noted here that the formation methods of the semiconductor structures shown in the drawings and described in this specification are merely a few examples of many formation methods that can employ the principles of the present disclosure. It should be clearly understood that the principles of the present disclosure are in no way limited to any details or any steps of the formations methods of the semiconductor structures shown in the drawings or described in this specification.

Based on the above detailed description of the exemplary embodiment of the method for forming semiconductor structure provided in the present disclosure, an exemplary embodiment of the semiconductor structure provided in the present disclosure will be described below with reference to FIGS. 10 and 11.

As shown in FIGS. 10 and 11, in this embodiment, a semiconductor structure is provided in the present disclosure, comprising a substrate 110, a plurality of bit line structures 130, a plurality of isolation line structures 160, an oxide material layer (i.e., the remaining first oxide material layer 120 at the boundary of the second region D2 in the above embodiment of the method), and a dummy isolation layer 150. Specifically, the substrate 110 is provided with a first region D1 and a second region D2, which may be an effective region and a dummy region of the substrate 110, respectively. The plurality of bit line structures 130 are arranged in the first region D1 of the substrate 110. The plurality of isolation line structures 160 are arranged in the first region D1 of the substrate 110, and each isolation line structure is between two adjacent bit line structures 130, so that through hole structures 170 exposing the substrate 110 are formed on both sides of the bit line structures 130, respectively. The oxide material layer is arranged at the boundary of the second region D2 of the substrate 110. The dummy isolation layer 150, which is roughly annular, is arranged in the second region D2 of the substrate 110 and between the boundary of the second region D2 and the first region D1, that is, between the oxide material layer and the first region D1. The isolation line structure 160 and the dummy isolation layer 150 may be respectively made of materials different from the oxide material layer, such as silicon nitride.

It should be noted here that the semiconductor structures shown in the drawings and described in this specification are merely a few examples of many semiconductor structures that can adopt the principles of the present disclosure. It should be clearly understood that the principles of the present disclosure are in no way limited to any details or any components of the semiconductor structure shown in the drawings or described in this specification.

To sum up, according to the method for forming semiconductor structure provided in the present disclosure, the annular empty slot structure can be formed on the second region of the substrate and between the remaining oxide material layers in the first region and the second region of the substrate. According to the present disclosure, the second material different from the oxide material is filled in the empty slot structure, so that the second region forms the annular dummy isolation layer between the first region and the oxide material layer, so as to effectively prevent short-circuited bit lines and node contacts in the node contact structure of the semiconductor structure manufactured by the method for forming semiconductor structure provided in the present disclosure, to greatly reduce the instability of the node contacts in the second region, and to improve the stability and reliability of the semiconductor structure.

While the present disclosure has been described with reference to several exemplary embodiments, it should be understood that the terms used are illustrative and exemplary rather than restrictive. As the present disclosure can be embodied in many forms without departing from the spirit or essence of the disclosure, it should be understood that the above embodiments are not limited to any of the foregoing details, but should be broadly interpreted within the spirit and scope defined by the appended claims, and therefore all variations and modifications falling into the claims or their equivalents should be covered by the appended claims.

The invention claimed is:

1. A method for forming semiconductor structure, comprising:
   providing a semiconductor base with a substrate and a first oxide material layer; wherein the first oxide material layer is arranged on the substrate, the first oxide material layer comprises a first region with a bit line structure and a second region located at edge of the first region;
   patterning and etching the first oxide material layer, to remove a part of the first oxide material layer in the first region and a part of the first oxide material layer in the second region; wherein oxide line structures are formed on both sides of each bit line structure by a remaining part of the first oxide material layer in the first region, and an annular empty slot structure is formed between a remaining part of the first oxide material layer in the second region and the first region;
   refilling a second material in the first region and in the second region, respectively; wherein the second material is different from a material of the first oxide material layer, the second material in the first region forms a plurality of isolation line structures, and the second material in the second region forms an annular dummy isolation layer;
   removing the oxide line structure by patterning and etching, and forming through hole structures each between a bit line structure and an isolation line structure next to the bit line structure; and
   forming a conductive material layer in the through hole structures to form a semiconductor structure.

2. The method for forming semiconductor structure according to claim 1, wherein the step of patterning and etching the first oxide material layer comprises:
   arranging a second mask layer and a first mask layer on the first oxide material layer in sequence;
   patterning and etching the first mask layer to form a first mask pattern;
   arranging a second oxide material layer on a surface of the first mask pattern and a surface of the second mask layer;
   removing the first mask pattern and part of the second oxide material layer, and reserving rest part of the second oxide material layer located on both sides of the first mask pattern to form a second mask pattern;
   arranging a first photoresist on part of the second mask pattern located in the second region; and
   etching and removing the second mask layer and part of the first oxide material layer by taking the second mask pattern as a mask.

3. The method for forming semiconductor structure according to claim 2, wherein the step of patterning and etching the first mask layer comprises:
   arranging a second photoresist on a surface of the first mask layer;
   patterning the second photoresist; and
   etching the first mask layer with the second photoresist.

4. The method for forming semiconductor structure according to claim 2, wherein the step of forming a second mask pattern comprises:
   removing part of the second oxide material layer which located on a top of the first mask pattern and on a surface of the second mask layer by etching; and
   removing the first mask pattern by etching.

5. The method for forming semiconductor structure according to claim 4, wherein an etch selectivity ratio of the first mask layer to the second oxide material layer is greater than 1.

6. The method for forming semiconductor structure according to claim 2, wherein the step of arranging a first photoresist comprises:
   covering the first photoresist on the surface of the first mask pattern; and
   patterning the first photoresist, to remove part of the first photoresist; wherein the removed part of the first photoresist is located in the first region and in part of the second region adjacent to the first region.

7. The method for forming semiconductor structure according to claim 1, wherein the step of removing the oxide line structure by patterning comprises:
   covering a third photoresist on a surface of the second material after refilling the second material;
   patterning the third photoresist, to remove the third photoresist located in the first region; and
   removing the oxide line structure by etching with the third photoresist.

8. The method for forming semiconductor structure according to claim 7, wherein the step of removing the oxide line structure comprises: removing the first oxide material layer by an etching solution.

9. The method for forming semiconductor structure according to claim 1, wherein the second material comprises silicon nitride.

10. A semiconductor structure, comprising:
    a substrate with a first region and a second region;
    a plurality of bit line structures arranged in the first region of the substrate;
    a plurality of isolation line structures arranged in the first region of the substrate, wherein each isolation line structure is located between two adjacent bit line structures, so that through hole structures exposing the substrate are formed on both sides of each bit line structure, respectively;
    an oxide material layer arranged at a boundary of the second region of the substrate; and
    an annular dummy isolation layer and arranged in the second region of the substrate, wherein the dummy isolation layer is between the first region and the oxide material layer.

* * * * *